(12) United States Patent
Hsu et al.

(10) Patent No.: US 6,764,911 B2
(45) Date of Patent: Jul. 20, 2004

(54) MULTIPLE ETCH METHOD FOR FABRICATING SPACER LAYERS

(75) Inventors: Jw-Wang Hsu, Taipei (TW); Ming-Huan Tsai, Jubei (TW); Mei-Ru Kuo, Yunlin (TW); Baw-Ching Peng, Hsin-chu (TW); Hun-Jan Tao, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/143,227

(22) Filed: May 10, 2002

(65) Prior Publication Data

US 2003/0211697 A1 Nov. 13, 2003

(51) Int. Cl.[7] ............................................. H01L 21/336
(52) U.S. Cl. ...................... 438/303; 438/299; 438/304; 438/595; 438/596
(58) Field of Search ................................ 438/299–307, 438/595–596

(56) References Cited

U.S. PATENT DOCUMENTS

| | | | | |
|---|---|---|---|---|
| 4,818,714 A | * | 4/1989 | Haskell | 438/231 |
| 5,783,475 A | * | 7/1998 | Ramaswami | 438/303 |
| 6,146,946 A | * | 11/2000 | Wang et al. | 438/264 |

* cited by examiner

Primary Examiner—Thanh Nguyen
(74) Attorney, Agent, or Firm—Tung & Associates

(57) ABSTRACT

Within a method for forming a spacer layer from a second layer formed of a second material laminated upon a first layer formed of a first material, in turn formed over a topographic feature, there is employed a three step etch method. The three step etch method employs: (1) a first etch method having a first enhanced etch selectivity for the second material with respect to the first material; (2) a second etch method having a second substantially neutral etch selectivity for the second material with respect to the first material; and (3) a third etch method having a third enhanced etch selectivity for the first material with respect to the second material. In accord with the three step etch method, the spacer layer is fabricated with enhanced dimensional control.

16 Claims, 2 Drawing Sheets

MULTIPLE ETCH METHOD FOR FABRICATING SPACER LAYERS

BACKGROUND OF THE INVENTION

1. Field of the Invention

The present invention relates generally to methods for fabricating spacer layers within microelectronic fabrications. More particularly, the present invention relates to methods for fabricating, with enhanced dimensional control, spacer layers within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions have decreased, it has become increasingly more common in the art of microelectronic fabrication to form adjoining sidewalls of patterned microelectronic conductor layers within microelectronic fabrications microelectronic spacer layers formed of dielectric materials. Microelectronic spacer layers are desirable in the art of microelectronic fabrication formed adjoining sidewalls of patterned microelectronic conductor layers within microelectronic fabrications insofar as microelectronic spacer layers assist in: (1) providing for adequate separation of adjoining or adjacent microelectronic conductor layers and microelectronic conductor regions within microelectronic fabrications (such as when microelectronic spacer layers are formed adjoining sidewalls of gate electrode microelectronic conductor layers within field effect transistor (FET) devices within semiconductor integrated circuit microelectronic fabrications to separate the same from source/drain microelectronic conductor regions within field effect transistor (FET) devices formed within the semiconductor integrated circuit microelectronic fabrications); or (2) providing for reduced defects, such as void defects, when forming dielectric layers interposed between patterned microelectronic conductor layers within microelectronic fabrications, including but not limited to semiconductor integrated circuit microelectronic fabrications.

While microelectronic spacer layers are thus desirable in the art of microelectronic fabrication and often essential in the art of microelectronic fabrication, microelectronic spacer layers are nonetheless not entirely without problems in the art of microelectronic fabrication.

In that regard, it is often difficult in the art of microelectronic fabrication to fabricate within microelectronic fabrications microelectronic spacer layers with enhanced dimensional control.

It is thus desirable in the art of microelectronic fabrication to fabricate within microelectronic fabrications microelectronic spacer layers with enhanced dimensional control.

It is towards the foregoing object that the present invention is directed.

Various microelectronic spacer layers having desirable properties, and methods for fabrication thereof, have been disclosed in the art of microelectronic fabrication.

Included among the microelectronic spacer layers and methods for fabrication thereof, but not limiting among the microelectronic spacer layers and methods for fabrication thereof, are microelectronic spacer layers and methods for fabrication thereof disclosed within: (1) Chen et al., in U.S. Pat. No. 5,573,965 (a multi-step conformal microelectronic dielectric spacer material layer formation method which provides, upon anisotropic etching of a series of conformal dielectric spacer material layers formed employing the method, a microelectronic dielectric spacer layer with enhanced dimensional control); (2) Gardner et al., in U.S. Pat. No. 5,899,721 (a multi-step microelectronic dielectric spacer layer fabrication method which provides horizontally laminated microelectronic dielectric spacer layers with diminished linewidth); (3) Hause et al., in U.S. Pat. No. 6,051,863 (a microelectronic dielectric spacer layer, and method for fabrication thereof, having a reentrant cross-sectional profile to provide for enhanced isolation of field effect transistor (FET) device gate electrode and source/drain region structures separated by the microelectronic dielectric spacer layer); and (4) Lam et al., in U.S. Pat. No. 6,190,961 (a two-step multiple step etch method for forming within a microelectronic fabrication a microelectronic spacer layer with a square shape having enhanced isolation properties).

The disclosures of each of the foregoing references are incorporated herein fully by reference.

Desirable in the art of microelectronic fabrication are additional methods for fabricating within microelectronic fabrications microelectronic spacer layers with enhanced dimensional control.

It is towards the foregoing object that the present invention is directed.

SUMMARY OF THE INVENTION

A first object of the present invention is to provide a method for fabricating a spacer layer within a microelectronic fabrication.

A second object of the present invention is to provide a method in accord with the first object of the present invention, wherein the spacer layer is fabricated with enhanced dimensional control.

In accord with the objects of the present invention, there is provided by the present invention a method for fabricating a spacer layer within a microelectronic fabrication.

To practice the method of the present invention, there is first provided a substrate having formed thereover a topographic feature. There is then formed over the substrate including the topographic feature a first layer of a first material having formed thereupon a second layer of a second material. There is then etched, while employing a first etch method having a first enhanced etch selectivity for the second material with respect to the first material, the second layer to form therefrom a second spacer layer formed upon the first layer. There is then etched, while employing a second etch method having a second substantially neutral etch selectivity for the second material with respect to the first material, the second spacer layer and first layer to form therefrom an etched second spacer layer formed upon a partially etched first layer. Finally, there is then etched, while employing a third etch method having a third enhanced etch selectivity for the first material with respect to the second material, the partially etched first layer to form a first spacer layer having formed thereupon the etched second spacer layer.

The present invention provides a method for fabricating a spacer layer within a microelectronic fabrication, wherein the spacer layer is fabricated with enhanced dimensional control.

The present invention realizes the foregoing object by employing when fabricating a spacer layer within a microelectronic fabrication a three step multi-step etch method for forming the spacer layer within the microelectronic fabrication from a second layer formed of a second material laminated to a first layer formed of a first material in turn formed over a topographic feature further in turn formed over a substrate employed within the microelectronic fabrication. Within the three step multi-step etch method there is employed sequentially: (1) a first etch method having a first enhanced etch selectivity for the second material with respect to the first material; (2) a second etch method having a second substantially neutral etch selectivity for the second material with respect to the first material; and (3) a third etch method having a third enhanced etch selectivity for the first material with respect to the second material.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for fabricating a spacer layer within a microelectronic fabrication, wherein the spacer layer is fabricated with enhanced dimensional control.

The present invention realizes the foregoing object by employing when fabricating a spacer layer within a microelectronic fabrication a three step multi-step etch method for forming the spacer layer within the microelectronic fabrication from a second layer formed of a second material laminated to a first layer formed of a first material in turn formed over a topographic feature further in turn formed over a substrate employed within the microelectronic fabrication. Within the three step multi-step etch method there is employed sequentially: (1) a first etch method having a first enhanced etch selectivity for the second material with respect to the first material; (2) a second etch method having a second substantially neutral etch selectivity for the second material with respect to the first material; and (3) a third etch method having a third enhanced etch selectivity for the first material with respect to the second material.

While the preferred embodiment of the present invention illustrates the present invention most particularly within the context of forming a pair of dielectric spacer layers adjacent a pair of sidewalls of a gate electrode topographic feature formed over a semiconductor substrate within a semiconductor integrated circuit microelectronic fabrication, the present invention is not intended to be so limited. Rather, the present invention may be employed for fabricating, with enhanced dimensional control, spacer layers adjacent topographic features formed over substrates employed within microelectronic fabrications selected from the group including but not limited to integrated circuit microelectronic fabrications, ceramic substrate microelectronic fabrications, solar cell optoelectronic microelectronic fabrications sensor image array optoelectronic microelectronic fabrications and display image array optoelectronic microelectronic fabrications. Similarly, within the present invention, each of a spacer layer, a topographic feature adjoining or adjacent which it is formed and a substrate over which it is formed may independently be formed from a microelectronic material selected from the group including but not limited to microelectronic conductor materials, microelectronic semiconductor materials and microelectronic dielectric materials.

Referring now to FIG. 1 to FIG. 5, there is shown a series of schematic cross-sectional diagrams illustrating the results of progressive stages of fabricating, in accord with a preferred embodiment of the present invention, a pair of dielectric spacer layers within a field effect transistor (FET) device within a semiconductor integrated circuit microelectronic fabrication.

Figure 1:
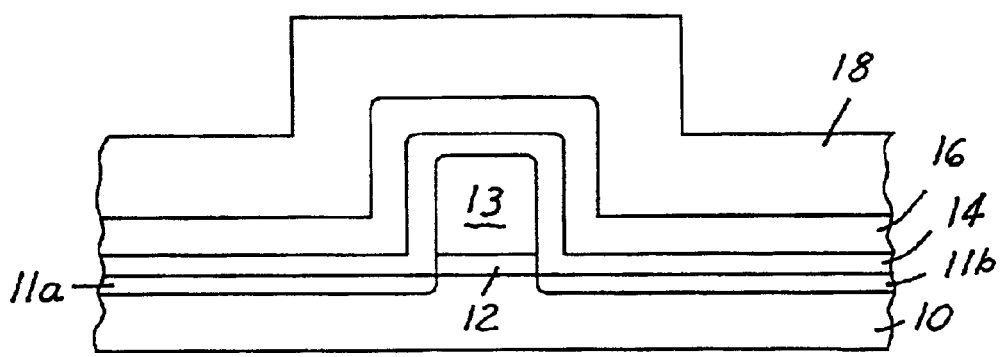
FIG. 1, FIG. 2, FIG. 3, FIG. 4 and FIG. 5 show a series of schematic cross-sectional diagrams illustrating the results of progressive stages of fabricating, in accord with a preferred embodiment of the present invention, a pair of spacer layers within a field effect transistor (FET) device within a semiconductor integrated circuit microelectronic fabrication.

Shown in FIG. 1 is a schematic cross-sectional diagram of the semiconductor integrated circuit microelectronic fabrication at an early stage in its fabrication in accord with the preferred embodiment of the present invention.

Shown in FIG. 1, in a first instance, is a semiconductor substrate 10 having formed thereupon a gate dielectric layer 12 in turn having formed thereupon a gate electrode 13.

Within the preferred embodiment of the present invention with respect to the semiconductor substrate 10, and although semiconductor substrates are known in the art of semiconductor integrated circuit microelectronic fabrication with either dopant polarity, several dopant concentrations and various crystallographic orientations, for the preferred embodiment of the present invention, the semiconductor substrate 10 is typically and preferably a (100) silicon semiconductor substrate having an N- or P-dopant concentration. Similarly, within the preferred embodiment of the present invention with respect to the gate dielectric layer 12, and although gate dielectric layers are also known in the art of semiconductor integrated circuit microelectronic fabrication to be formed employing various methods and materials, for the preferred embodiment of the present invention the gate dielectric layer 12 is typically and preferably formed of a silicon oxide gate dielectric material, formed employing a thermal oxidation method and formed to a thickness of from about 30 to about 500 angstroms upon the semiconductor substrate 10. Finally, within the preferred embodiment of the present invention with respect to the gate electrode 13, and although gate electrodes are known in the art of semiconductor integrated circuit microelectronic fabrication to be formed from various conductor materials, such as metals, metal alloys, doped polysilicon and polycide (doped polysilicon/metal silicide stack) conductor materials, for the preferred embodiment of the present invention, the gate electrode 13 is typically and preferably formed of a doped polysilicon or polycide gate electrode conductor material, formed to a thickness of from about 300 to about 2500 angstroms upon the gate dielectric layer 12.

Shown also within the schematic cross-sectional diagram of FIG. 1, and formed within the semiconductor substrate 10 while employing the gate electrode 13 and the gate dielectric layer 12 as a mask, is a pair of lightly doped extension regions 11a and 11b.

Within the preferred embodiment of the present invention with respect to the pair of lightly doped extension regions 11a and 11b, the pair of lightly doped extension regions 11a and 11b is typically and formed employing an ion implant method as is otherwise generally conventional in the art of semiconductor integrated circuit microelectronic fabrication, to provide the pair of lightly doped extension regions 11a and 11b of appropriate dopant polarity within the semiconductor substrate 10.

Shown also within the schematic cross-sectional diagram of FIG. 1, and formed laminated upon or over the semiconductor substrate 10, including the gate dielectric layer 12 and the gate electrode 13, is a series of three blanket conformal layers comprising: (1) a blanket first conformal dielectric spacer material layer 14 formed upon exposed portions of the semiconductor substrate 10, the gate dielectric layer 12 and the gate electrode 13; (2) a blanket second conformal dielectric spacer material layer 16 formed upon the blanket first conformal dielectric spacer material layer 14; and (3) a blanket third conformal dielectric spacer material layer 18 formed upon the blanket second conformal dielectric spacer material layer 16.

Within the preferred embodiment of the present invention with respect to the foregoing three blanket conformal dielectric spacer material layers, each is formed from a separate dielectric spacer material from the dielectric spacer material layer which it adjoins. Similarly, while the blanket first conformal dielectric spacer material layer 14 and the blanket third conformal dielectric spacer material layer 18 may be formed of different dielectric spacer materials, they may also be formed of equivalent or identical dielectric spacer materials.

Thus, although several dielectric materials combinations are thus plausible within the context of the preferred embodiment of the present invention for forming the blanket first conformal dielectric spacer material layer 14, the blanket second conformal dielectric spacer material layer 16 and the blanket third conformal dielectric spacer material layer 18, each of the blanket first conformal dielectric spacer material layer 14 and the blanket third conformal dielectric spacer material layer 18 is typically and preferably formed of a silicon oxide dielectric material, while the blanket second conformal dielectric spacer material layer 16 is typically and preferably formed of a silicon nitride dielectric material. However, a reverse ordering of the foregoing materials is also within the context of the preferred embodiment of the present invention, as is an appropriate ordering of materials which incorporates a silicon oxynitride material.

Typically and preferably, the blanket first conformal dielectric spacer material layer 14 is formed to a thickness of from about 20 to about 300 angstroms, the blanket second conformal dielectric spacer material layer 16 is formed to a thickness of from about 50 to about 1000 angstroms and the blanket third conformal dielectric spacer material layer 18 is formed to a thickness of from about 50 to about 1500 angstroms.

As is understood by a person skilled in the art, although the preferred embodiment of the present invention illustrates the invention most particularly within the context of a series of three strictly conformal dielectric spacer material layers, as is generally most preferred within the present invention and the preferred embodiment of the present invention, such is not specifically required within the present invention.

Figure 2:
Figure 2:
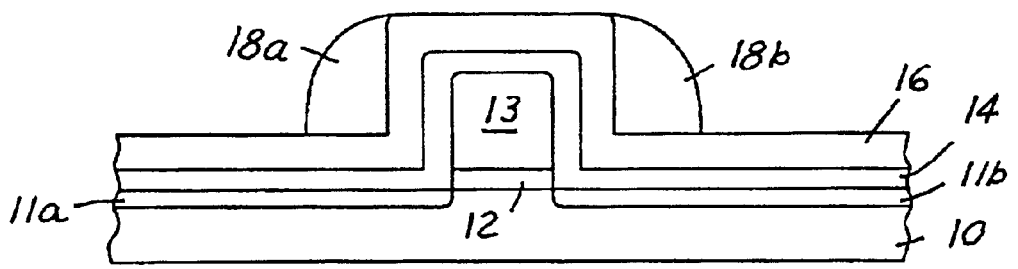

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein the blanket third conformal dielectric spacer material layer 18 has been etched, while employing a first etching plasma 20, to form a pair of third spacer layers 18a and 18b laterally separated by the gate electrode 13 and not formed over the gate electrode 13.

Within the preferred embodiment of the present invention with respect to the first etching plasma 20, the first etching plasma 20 employs materials and process limitations such as to provide a first enhanced etch selectivity for a third material from which is formed the blanket third conformal dielectric spacer material layer 18 with respect to a second material from which is formed the blanket second conformal dielectric spacer material layer 16. Such a first enhanced etch selectivity is intended as greater than about 5:1, more typically and preferably from about 7:1 to about 20:1 and most typically and preferably from about 10:1 to about 50:1. Within the context of the foregoing first etch selectivity limitations, the pair of third spacer layers 18a and 18b may be formed absent significant etching of the blanket second conformal dielectric spacer material layer 16.

Figure 3:
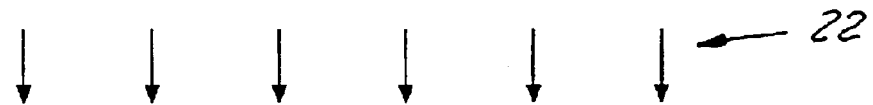
Figure 3:
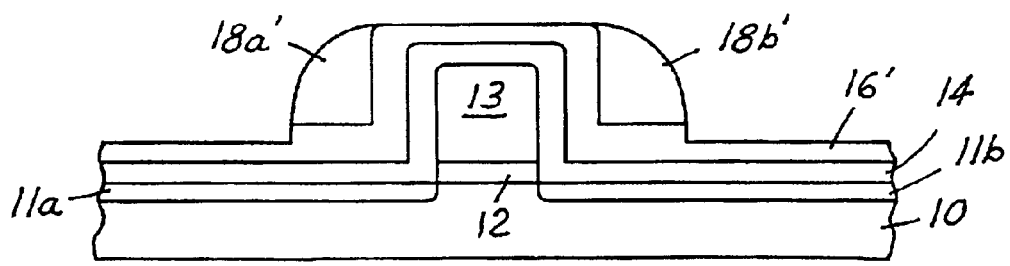

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein: (1) the pair of third spacer layers 18a and 18b has been further etched to form a pair of further etched third spacer layers 18a' and 18b'; and (2) the blanket second conformal dielectric spacer material layer 16 has been partially etched to form a partially etched blanket second conformal dielectric spacer material layer 16', while employing a second etching plasma 22.

Within the preferred embodiment of the present invention with respect to the second etching plasma 22, the second etching plasma 22 employs materials and process limitations such that a second etch selectivity for the third material from which is formed the pair of third spacer layers 18a and 18b with respect to the second material from which is formed blanket second conformal dielectric spacer material layer 16 is substantially neutral, and in a range from about 2:1 to about 0.5:1. As is further illustrated within the schematic cross-sectional diagram of FIG. 3, from about 10 to about 50 percent of the exposed thicknesses of the blanket second conformal dielectric spacer material layer 16 are etched when forming therefrom the partially etched blanket second conformal dielectric spacer material layer 16'.

Figure 4:
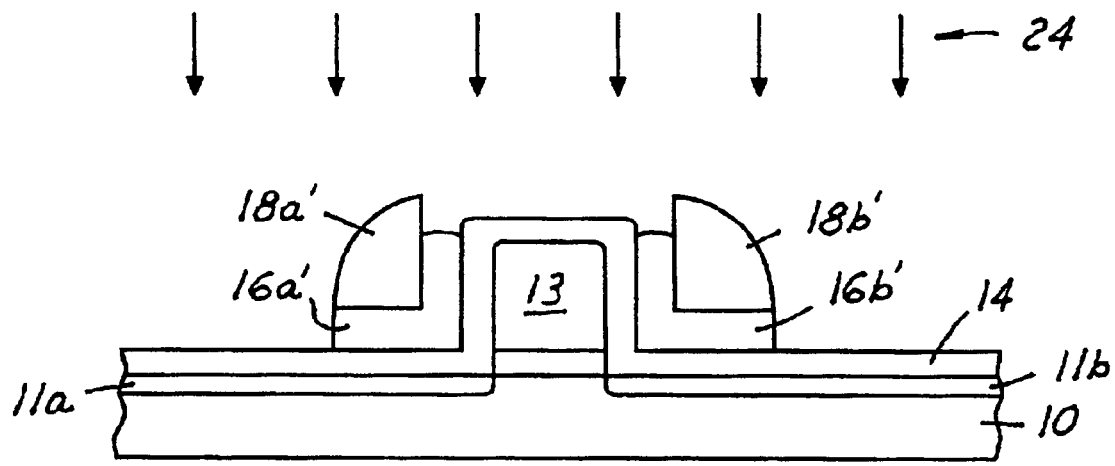

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein the partially etched blanket second conformal dielectric spacer material layer 16' has been patterned, while employing the pair of further etched third spacer layers 18a' and 18b' as a mask, and while employing a third etching plasma 24.

Within the preferred embodiment of the present invention with respect to the third etching plasma 24, the third etching plasma has a third enhanced etch selectivity for the second material from which is formed the partially etched blanket second conformal dielectric spacer material layer 16' with respect to the third material from which is formed the pair of further etched third spacer layers 18a' and 18b'. Typically and preferably, the third enhanced etch selectivity is greater than about 5:1, more typically and preferably from about 7:1 to about 20:1 and most typically and preferably from about 10:1 to about 50:1.

Within the preferred embodiment of the present invention with respect to specific materials and process limitations employed within the first etching plasma 20, the second etching plasma 22 and the third etching plasma 24 such as to provide the foregoing first enhanced etch selectivity, second substantially neutral etch selectivity and third enhanced etch selectivity, and as is understood by a person skilled in the art, each of the first etching plasma 20, the second etching plasma 22 and the third etching plasma 24 may be provided employing materials and process parameters as are otherwise employed for etching silicon oxide dielectric materials and silicon nitride dielectric materials, but with a variable incorporation of an oxidant inhibitor material such as to provide an enhanced etch selectivity, a substantially neutral etch selectivity or a retarded etch selectivity for a silicon oxide material with respect to a silicon nitride material. Thus, within the preferred embodiment of the present invention an etchant gas composition employed within each of the first etchant plasma 20, the second etchant plasma 22 and the third etchant plasma 24 may comprise at least one fluorocarbon etchant gas (such as but not limited to a C1 to C4 perfluorocarbon etchant gas or a C1 to C4 hydrofluorocarbon etchant gas), along with an optional sputter component gas (such as an argon sputter component gas), further along with a variable oxidant inhibitor component gas (such as but not limited to an oxygen, a carbon monoxide or a carbon dioxide oxidant inhibitor component gas), in order to provide the foregoing desired first enhanced etch selectivity, second substantially neutral etch selectivity and third enhanced etch selectivity.

Similarly, each of the first etching plasma 20, the second etching plasm 22 and the third etching plasm 24 will also employ with respect to semiconductor substrate 10: (1) a reaction chamber pressure of from about 30 to about 200 torr; (2) a radio frequency source power of from about 50 to about 1200 watts and a bias power or from about 50 to about 800 watts; (3) a semiconductor substrate 10 (and overlying layers) temperature of from about 10 to about 80 degrees centigrade; (4) a fluorine containing etchant gas flow rate of from about 3 to about 50 standard cubic centimeters per minute (sccm); (5) a sputter component gas flow rate of from about 50 to about 500 standard cubic centimeters per minute (sccm); and (5) an oxidant inhibitor gas flow rate in a range of from about 5 to about 70 standard cubic centimeters per minute (sccm).

As is further understood by a person skilled in the art, while the preferred embodiment of the present invention discloses the present invention most particularly within the context of a three step etch method employing a series of three nominally anisotropic plasma etch methods in turn having specified etch selectivities, the present invention may also be employed, with generally somewhat less favorable results, while employing a series of three etch methods of at least partial isotropic character. Such isotropic etch methods may be either higher pressure plasma etch isotropic etch methods or wet chemical isotropic etch methods.

Within the context of the preferred embodiment of the present invention, a series of three isotropic etch methods may, for example and without limitation, employ: (1) a hydrofluoric acid containing etchant for etching a silicon oxide material with an enhanced etch selectivity with respect to a silicon nitride material; (2) a phosphoric acid material for etching a silicon nitride material with an enhanced etch selectivity with respect to a silicon oxide material; and (3) a mixture of the foregoing two etchants for simultaneously etching a silicon oxide material and a silicon nitride material without a substantially neutral etch selectivity.

Figure 5:
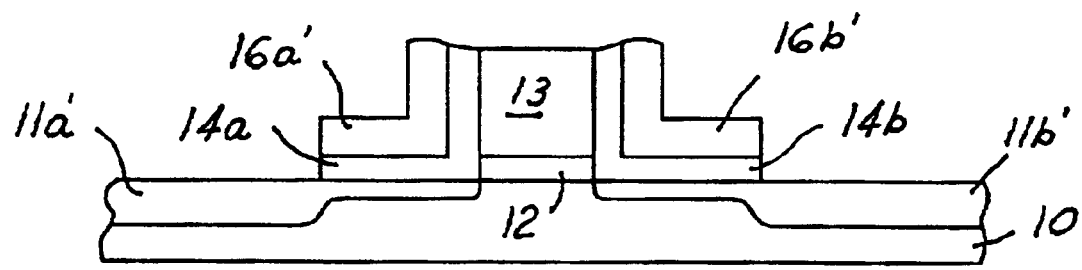

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated within FIG. 4, but wherein, in a first instance: (1) the pair of further etched third spacer layers 18a' and 18b' has been stripped from the pair of patterned second conformal spacer layers 16a' and 16b'; and (2) the blanket first conformal dielectric spacer material layer 14 has been patterned to form a pair of patterned first conformal dielectric spacer layers 14a and 14b.

Within the preferred embodiment of the present invention, and under circumstances where the blanket first conformal dielectric spacer material layer 14 and the pair of further etched third spacer layers 18a' and 18b' are formed of a silicon oxide material, the pair of further etched third spacer layers 18a' and 18b' may be stripped from the pair of patterned second conformal dielectric spacer layers 16a' and 16b' and the blanket first conformal dielectric spacer layer 14 may be patterned to form the pair of patterned first conformal dielectric spacer layers 14a and 14b, incident to stripping and etching within a hydrofluoric acid containing wet chemical etchant, or in an alternative within a plasma etchant analogous or equivalent to that employed within the first etching plasma 20 as illustrated within the schematic cross-sectional diagram of FIG. 2.

Similarly, there is also shown within the schematic cross-sectional diagram of FIG. 5, and formed within the semiconductor substrate 10 while employing the pair of patterned second conformal spacer layers 16a' and 16b', the pair of patterned first conformal spacer layers 14a and 14b, the gate dielectric layer 12 and the gate electrode 13 as a mask, a pair of source/drain regions 11a' and 11b' which in part incorporate the pair of lightly doped extension regions 11a and 11b as illustrated within the schematic cross-sectional diagram of FIG. 4.

Within the preferred embodiment of the present invention, the pair of source/drain regions 11a' and 11b' may be formed employing ion implant methods as are conventional in the art of semiconductor integrated circuit microelectronic fabrication, to provide more heavily doped portions of the source/drain regions 11a' and 11b' as formed further removed from the gate electrode 13.

Finally, as is illustrated within the schematic cross-sectional diagram of FIG. 5, the pair of patterned second conformal spacer layers 16a' and 16b' in particular, and also the pair of patterned first conformal spacer layers 14a and 14b to a lesser extent, are formed with flat tops (i.e., with enhanced dimensional control) adjoining or adjacent the exposed surface of the gate electrode 13. Such is desirable in the art of semiconductor integrated circuit microelectronic fabrication insofar as such inhibits intrusion and shorting of metal silicide layers as subsequently formed upon exposed surfaces of the gate electrode 13 and the pair of source/drain regions 11a' and 11b'.

Upon fabricating the semiconductor integrated circuit microelectronic fabrication whose schematic cross-sectional diagram is illustrated in FIG. 5, there is fabricated in accord with the preferred embodiment of the present invention, and within a field effect transistor (FET) device within the semiconductor integrated circuit microelectronic fabrication, a pair of spacer layers with enhanced dimensional control.

The present invention realizes the foregoing object by employing when fabricating a spacer layer within a microelectronic fabrication a three step multi-step etch method for forming the spacer layer within the microelectronic fabrication from a second spacer material layer formed of a second spacer material laminated to upon a first spacer material layer formed of a first spacer material in turn formed over a topographic feature further in turn formed over a substrate employed within the microelectronic fabrication. Within the three step multi-step etch method there is employed sequentially: (1) a first etch method having a first enhanced etch selectivity for the second material with respect to the first material; (2) a second etch method having a second substantially neutral etch selectivity for the second material with respect to the first material; and (3) a third etch method having a third enhanced etch selectivity for the first material with respect to the second material.

As is understood by a person skilled in the art, the preferred embodiment of the present invention is illustrative of the present invention rather than limiting of the present invention. Revisions and modifications may be made to methods, materials, structures and dimensions employed in fabricating a spacer layer in accord with the preferred embodiment of the present invention, while still fabricating a spacer layer in accord with the present invention, further in accord with the accompanying claims.

What is claimed is:

1. A method for fabricating a spacer layer comprising:
   providing a substrate having formed thereover a topographic feature;
   forming over the substrate including the topographic feature a first layer of a first material having formed thereupon a second layer of a second material;
   etching, while employing a first etch method having a first enhanced etch selectivity for the second material with respect to the first material, the second layer to form therefrom a second spacer layer formed upon the first layer;
   etching, while employing a second etch method having a second substantially neutral etch selectivity for the second material with respect to the first material, the second spacer layer and first layer to form therefrom an etched second spacer layer formed upon a partially etched first layer; and
   etching, while employing a third etch method having a third enhanced etch selectivity for the first material with respect to the second material, the partially etched first layer to form a first spacer layer having formed thereupon the etched second spacer layer wherein outer side surface of said first spacer and said second spacer are aligned.

2. The method of claim 1 wherein:
   the first enhanced etch selectivity for the second material with respect to the first material is greater than about 5:1;
   the second substantially neutral etch selectivity for the second material with respect to the first material is from about 2:1 to about 0.5:1; and
   the third enhanced etch selectivity for the first material with respect to the second material is greater than about 5:1.

3. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

4. The method of claim 1 wherein each of the substrate, the topographic feature, the first layer and the second layer is independently formed from a material selected from the group consisting of conductor materials, semiconductor materials and dielectric materials.

5. The method of claim 1 wherein the first layer is formed to a thickness of from about 50 to about 1000 angstroms.

6. The method of claim 1 wherein the second layer is formed to a thickness of from about 50 to about 1500 angstroms.

7. The method of claim 1 wherein each of the first etch method, the second etch method and the third etch method is an anisotropic etch method.

8. The method of claim 1 wherein each of the first etch method, the second etch method and the third etch method is an isotropic etch method.

9. A method for fabricating a spacer layer comprising:
   providing a semiconductor substrate having formed thereover a topographic feature; forming over the semiconductor substrate including the topographic feature a first layer of a first material having formed thereupon a second layer of a second material;
   etching, while employing a first etch method having a first enhanced etch selectivity for the second material with respect to the first material, the second layer to form therefrom a second spacer layer formed upon the first layer;
   etching, while employing a second etch method having a second substantially neutral etch selectivity for the second material with respect to the first material, the second spacer layer and first layer to form therefrom an etched second spacer layer formed upon a partially etched first layer; and
   etching, while employing a third etch method having a third enhanced etch selectivity for the first material with respect to the second material, the partially etched first layer to form a first spacer layer having formed thereupon the etched second spacer layer wherein outer side surface of said first spacer and said second spacer are aligned.

10. The method of claim 9 wherein:
    the first enhanced etch selectivity for the second material with respect to the first material is greater than about 5:1;
    the second substantially neutral etch selectivity for the second material with respect to the first material is from about 2:1 to about 0.5:1; and
    the third enhanced etch selectivity for the first material with respect to the second material is greater than about 5:1.

11. The method of claim 9 wherein the first layer is formed to a thickness of from about 50 to about 1000 angstroms.

12. The method of claim 9 wherein the second layer is formed to a thickness of from about 50 to about 1500 angstroms.

13. The method of claim 9 wherein each of the first etch method, the second etch method and the third etch method is an anisotropic etch method.

14. The method of claim 9 wherein each of the first etch method, the second etch method and the third etch method is an isotropic etch method.

15. The method of claim 9 wherein the first material and the second material are separate materials selected from the group consisting of silicon oxide materials, silicon nitride materials and silicon oxynitride materials.

16. The method of claim 9 wherein the topographic feature is a patterned conductor layer.

* * * * *